United States Patent
Zhao et al.

(10) Patent No.: US 9,431,170 B2
(45) Date of Patent: Aug. 30, 2016

(54) 0.2SS CLASS SPECIAL-TYPE HIGH-VOLTAGE MEASURING CURRENT TRANSFORMER

(71) Applicants: JILIN PROVINCE ELECTRIC POWER RESERCH INSTITUTE, Changchun, Jilin (CN); JILIN PROVINCE ELECTRIC POWER RESERCH INSTITUTE LTD., Changchun, Jilin (CN); STATE GRID COMPANY, Beijing (CN)

(72) Inventors: Shixiang Zhao, Jilin (CN); Ming Ao, Jilin (CN); Liwei Zhou, Jilin (CN); Jianrong Yang, Jilin (CN); Wenzhan Cai, Jilin (CN); Zhongbao Feng, Jilin (CN); Ping Ren, Jilin (CN); Junxin Zhao, Jilin (CN); Zhi Xia, Jilin (CN)

(73) Assignees: JILIN PROVINCE ELECTRIC POWER RESERCH INSTITUTE, Changchun, Jilin (CN); JILIN PROVINCE ELECTRIC POWER RESERCH INSTITUTE LTD., Changchun, Jilin (CN); STATE GRID COMPANY, Beijing (CN)

( * ) Notice: Subject to any disclaimer, the term of this patent is extended or adjusted under 35 U.S.C. 154(b) by 0 days.

(21) Appl. No.: 14/649,294

(22) PCT Filed: Aug. 2, 2013

(86) PCT No.: PCT/CN2013/080675
§ 371 (c)(1),
(2) Date: Jun. 3, 2015

(87) PCT Pub. No.: WO2014/089977
PCT Pub. Date: Jun. 19, 2014

(65) Prior Publication Data
US 2015/0348704 A1     Dec. 3, 2015

(30) Foreign Application Priority Data

Dec. 11, 2012 (CN) .......................... 2012 1 0533061

(51) Int. Cl.
| | |
|---|---|
| H01F 27/24 | (2006.01) |
| H01F 27/28 | (2006.01) |
| H01F 38/30 | (2006.01) |
| H01F 27/245 | (2006.01) |
| G01R 15/18 | (2006.01) |
| H01F 27/26 | (2006.01) |
| H01F 27/30 | (2006.01) |

(52) U.S. Cl.
CPC ............... *H01F 38/30* (2013.01); *G01R 15/18* (2013.01); *H01F 27/245* (2013.01); *H01F 27/26* (2013.01); *H01F 27/30* (2013.01)

(58) Field of Classification Search
USPC ................................................ 336/216–218
See application file for complete search history.

(56) References Cited

U.S. PATENT DOCUMENTS 5,371,486 A     12/1994 Yamada et al.

FOREIGN PATENT DOCUMENTS

| CN | 2069607 | 1/1991 |
| CN | 1062792 | 7/1992 |

(Continued)

*Primary Examiner* — Elvin G Enad
*Assistant Examiner* — Ronald Hinson

(57) ABSTRACT

A 0.2Ss class special-type high-voltage measuring current transformer belongs to a field of current transformer. An iron core includes two kinds of "L"-shaped sheets with the same size, wherein a ratio of a long side to a short side of each "L"-shaped sheet is 3:2; a first kind of the "L"-shaped sheets are permalloy sheets (1) and a second kind of the "L"-shaped sheets are cold rolled silicon steel sheets (2); and required windings are wound on each side of the iron core. Sheets of the iron core of the current transformer include the permalloy sheets and the cold rolled silicon steel sheets, which improves performance of the iron core. Utilizing structural characteristics of the iron core of different materials, a fractional turn compensation of coils is formed, which realizes a precise measurement.

2 Claims, 2 Drawing Sheets

(56) References Cited

FOREIGN PATENT DOCUMENTS

| | | |
|---|---|---|
| CN | 201196897 | 2/2009 |
| CN | 202585088 | 12/2012 |
| CN | 102969138 | 3/2013 |
| CN | 203085347 | 7/2013 |
| EP | 0077487 | 4/1983 |
| JP | 09162050 | 6/1997 |
| JP | 2010056422 | 3/2010 |

# 0.2SS CLASS SPECIAL-TYPE HIGH-VOLTAGE MEASURING CURRENT TRANSFORMER

CROSS REFERENCE OF RELATED APPLICATION

This is a U.S. National Stage under 35 U.S.C 371 of the International Application PCT/CN2013/080675, filed Aug. 2, 2013, which claims priority under 35 U.S.C. 119(a-d) to CN 201210533061.5, filed Dec. 11, 2012.

BACKGROUND OF THE PRESENT INVENTION

1. Field of Invention

The present invention relates to a special-type high-voltage measuring current transformer.

2. Description of Related Arts

A plurality of lines in substations often work in a weak current and weak magnetic field condition where the conventional high-voltage transformers are unable to measure, causing various types of trade meters, monitoring instruments and monitoring microcomputers unable to work normally.

The weak current is often in thousandths of a rated current of the transformer, so as to cause the following three problems.

a) The conventional high-voltage transformers have measuring performance only for hundredths of the rated current, despite of a large error. For example, the error of the 0.2Ss class transformer reaches ±0.2% for more than two tenths of the rated current and the error of the 0.2Ss class transformer for the hundredths of the rated current is ±0.3% to ±0.8%.

b) It is impossible to change the measuring performance in the weak magnetic field by changing the transformation ratio, not to mention to change the measurement precision. For example, when the transformer is changed from 600/5 A to 100/5 A, the weak current of 1.2 A is changed from 2‰$I_N$ to 1.2% $I_N$.

c) As the primary equipment running in high-voltage lines, the high-voltage transformer is not allowed to be changed from 600/5 A to 100/5 A for a protection purpose.

SUMMARY OF THE PRESENT INVENTION

The present invention provides a 0.2Ss class special-type high-voltage measuring current transformer, so as to solve the problems that various types of trade meters, monitoring instruments and monitoring microcomputers are unable to work normally, because the lines in substations often work in a weak current and weak magnetic field condition where the conventional high-voltage transformers are unable to measure.

The adopted technical solutions of the present invention are described as follows.

An iron core comprises two kinds of "L"-shaped sheets with the same size, wherein a ratio of a long side to a short side of each "L"-shaped sheet is 3:2. A first kind of the "L"-shaped sheets are permalloy sheets and a second kind of the "L"-shaped sheets are cold rolled silicon steel sheets.

Detailed structures of the iron core are described as follows:

a permalloy sheet is assembled with a cold rolled silicon steel sheet into a "rectangle" shape as a base layer of each layer of the iron core;

odd-numbered basic layers and even-numbered basic layers are arranged in an alternate assembly manner, wherein the alternate assembly manner comprises: each odd-numbered basic layer is identically arranged; each even-numbered basic layer is identically arranged; and each even-numbered basic layer is rotated 180 degrees along a horizontal center transverse axis relative to the corresponding odd-numbered basic layer;

the iron core has a first long side assembled by the permalloy sheets, a second long side assembled by the cold rolled silicon steel sheets, and two short sides;

an electric energy measuring winding and a monitoring winding are respectively wound on the first long side of the iron core; a last circle of the electric energy measuring winding and a last circle of the monitoring winding respectively come out of the respective short sides of the iron core neighboring with the first long side of the iron core;

a first relay protection winding and a second relay protection winding are respectively wound on the second long side of the iron core, wherein the first relay protection winding is 5P class and the second relay protection winding is 5P class; and a third relay protection winding and a fourth relay protection winding are respectively wound on the two short sides of the iron core, wherein the third relay protection winding is 3P class or 5P class and the fourth relay protection winding is 3P class or 5P class.

The permalloy of the present invention is embodied to be iron-nickel alloy with a nickel content of 70% to 81%.

The advantages of the present invention are described as follows. The present invention has a novel structure; a part of the sheets of the iron core adopts a permeability material, the permalloy with the nickel content of 70% to 81%; the present invention extends new performance of the iron core and achieves a special object; the assembled structure of the iron core is ingenious, taking a full consideration of structure toughness, expanding performance, winding uses and specifications, to form a unique design idea of the iron core; a unique winding method of coils is designed, making full use of characteristics of the iron core; and an error compensation method of " iron core+coil" for different windings is formed, making full use of structural characteristics of the iron core of different materials and forming a fractional turn compensation of the coils, so as to realize a precise measurement.

Main specifications of the present invention:

a) primary voltage: 220/110/66/35 kV;

b) rated transformation ratio: 600/300/150/5A; 2000/1000/1A;

c) combination: electric energy measuring winding: 0.2Ss; monitoring winding: 0.2Ss (0.5Ss); third relay protection winding: 3 (5) P; fourth relay protection winding: 3 (5) P; first relay protection winding: 5P; and second relay protection winding: 5P; and d) product features: the present invention has precise measuring performance for a current in thousandths of a rated current and an error of ±0.2%; that is to say, since the thousandths of the rated current, the present invention begins to have a precise trade measurement, a normal monitoring and a reliable protection control.

These and other objectives, features, and advantages of the present invention will become apparent from the following detailed description, the accompanying drawings, and the appended claims.

DETAILED DESCRIPTION OF THE PREFERRED EMBODIMENT

Figure 1:
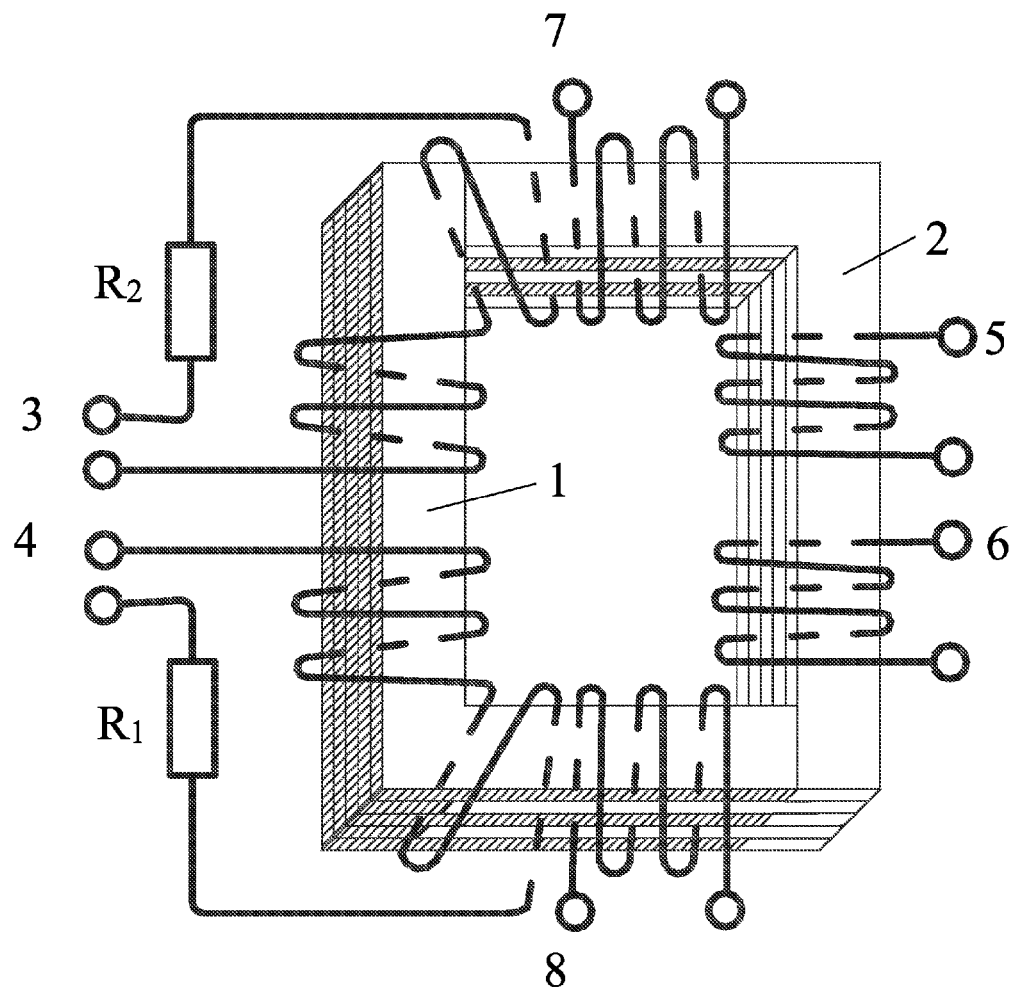
FIG. 1 is a sketch view of a 0.2Ss class special-type high-voltage measuring current transformer according to preferred embodiments of the present invention.

The present invention has the following definition of "0.2Ss class". "0.2S" represents that a measurement precision of the present invention meets requirements of a 0.2S class high-voltage transformer; and "s" represents that the high-voltage transformer of the present invention is able to precisely measure a current in thousandths of a rated current.

Following embodiments of the present invention are illustrated by taking five basic layers as an example, but the number of the basic layers of the present invention is not limited to five.

A 3P class relay protection winding and a 5P class relay protection winding, illustrated in the present invention, are known to ones skilled in the art. Definitions of "3P" and "5P" are described as follows: "3P" and "5P" stand for an accuracy class of every relay protection winding; "3" represents that a highest permissible percentage of a composite error is 3; "5" represents that the highest permissible percentage of the composite error is 5; and "P" stands for protection.

First Embodiment

An iron core comprises two kinds of "L"-shaped sheets with the same size, wherein a ratio of a long side to a short side of each "L"-shaped sheet is 3:2. A first kind of the "L"-shaped sheets are permalloy sheets 1 and a second kind of the "L"-shaped sheets are cold rolled silicon steel sheets 2.

Detailed structures of the iron core are described as follows:

a permalloy sheet is assembled with a cold rolled silicon steel sheet into a "rectangle" shape as a base layer of each layer of the iron core;

odd-numbered basic layers and even-numbered basic layers are arranged in an alternate assembly manner, wherein the alternate assembly manner comprises: each odd-numbered basic layer is identically arranged; each even-numbered basic layer is identically arranged; and each even-numbered basic layer is rotated 180 degrees along a horizontal center transverse axis relative to the corresponding odd-numbered basic layer;

the iron core has a first long side assembled by the permalloy sheets, a second long side assembled by the cold rolled silicon steel sheets and two short sides; an electric energy measuring winding 3 and a monitoring winding 4 are respectively wound on the first long side of the iron core; a last circle of the electric energy measuring winding and a last circle of the monitoring winding respectively come out of the respective short sides of the iron core neighboring with the first long side of the iron core;

a first relay protection winding and a second relay protection winding are respectively wound on the second long side of the iron core, wherein the first relay protection winding is 5P class and the second relay protection winding is 5P class; a third relay protection winding and a fourth relay protection winding are respectively wound on the two short sides of the iron core, wherein the third relay protection winding is 3P class or 5P class and the fourth relay protection winding is 3P class or 5P class. In the first embodiment of the present invention, the permalloy is iron-nickel alloy with a nickel content of 70%.

Second Embodiment

In the second embodiment of the present invention, the permalloy is the iron-nickel alloy with the nickel content of 75%. The other structures of the second embodiment are the same as the structures of the first embodiment.

Third Embodiment

In the third embodiment of the present invention, the permalloy is the iron-nickel alloy with the nickel content of 81%. The other structures of the third embodiment are the same as the structures of the first embodiment.

The present invention is further illustrated with the drawings.

Figure 2:
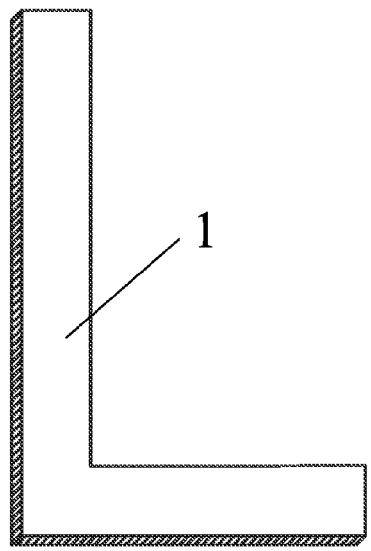
FIG. 2 is a sketch view of an "L"-shaped permalloy sheet according to the preferred embodiments of the present invention.
Figure 3:
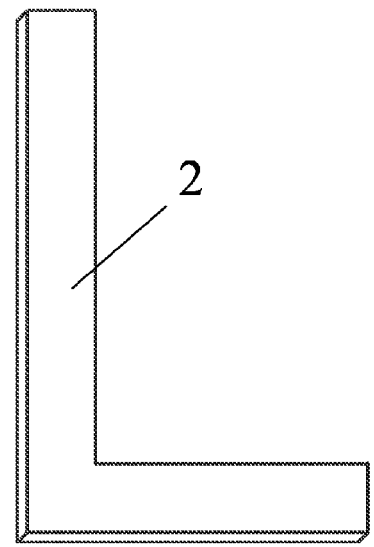
FIG. 3 is a sketch view of an "L"-shaped cold rolled silicon steel sheet according to the preferred embodiments of the present invention.

Referring to FIG. 2 and FIG. 3 of the drawings, performance and simple structural characteristics of the sheets of two different materials are illustrated. The iron cores of the conventional high-voltage transformer are made of the cold rolled silicon steel sheets, but the cold rolled silicon sheets have little permeability performance for a current in the thousandths of the rated current. To realize measuring performance of the high-voltage current transformers in a weak current and weak magnetic field condition, the permalloy is adopted for the iron cores. However, the permalloy is expensive and the windings of the iron core made of the permalloy have a poor anti-saturation performance Considering the expensive permalloy and the poor anti-saturation performance of the relay protection windings, it is undesirable for the iron core to be merely made of the permalloy.

Thus, the present invention adopts both the permalloy sheets and the cold rolled silicon steel sheets to assemble. Different sections of a complete iron core of the high-voltage transformer are made of different materials and play different permeability performance and measuring performance. The sheets made of the two different materials have the same size, which is good for a uniform production process and an assembly with a small gap. The ratio of the long side to the short side of the two kinds of the "L"-shaped sheets is 3:2 and a height of the assembled iron core is slightly larger than a width of the assembled iron core, which conforms to a general idea of the production process of the iron core and saves coil wires.

Figure 4:
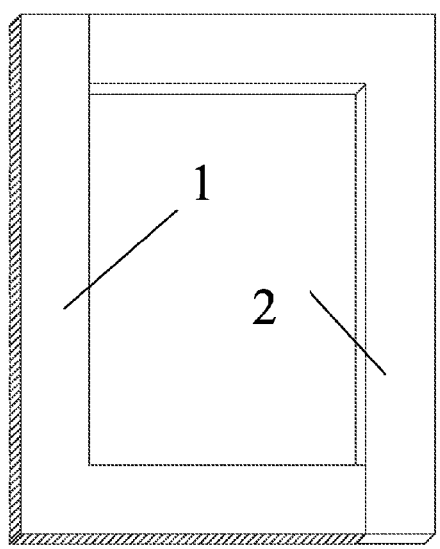
FIG. 4 is a sketch view of a basic layer of an iron core, the basic layer being assembled into a "rectangle" shape by the permalloy sheet and the cold rolled silicon steel sheet, according to the preferred embodiments of the present invention.
Figure 5:
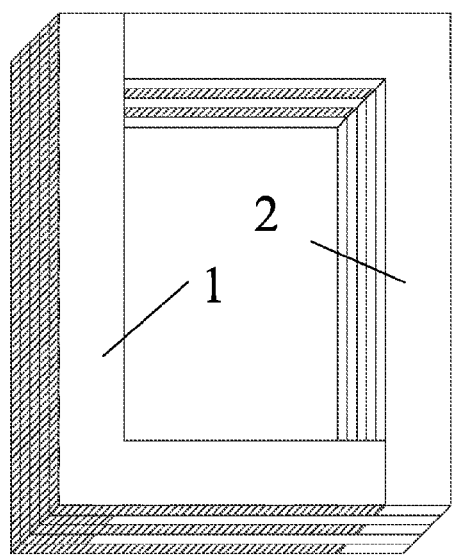
FIG. 5 is a sketch view of the iron core according to the preferred embodiments of the present invention.

According to FIG. 4 and FIG. 5, an assembly manner of the sheets of different materials and structural features of the iron core are illustrated. A permalloy sheet is assembled with a cold rolled silicon steel sheet into a shape showed in FIG. 4, respectively as a first layer, a third layer and a fifth layer (odd-numbered layers) of the iron core and a second layer and a fourth layer (even-numbered layers) of the iron core, wherein the second layer and the fourth layer (even-numbered layers) of the iron core are respectively rotated 180 degrees along the horizontal center transverse axis relative to the corresponding odd-numbered layers; then the even-numbered layers and the odd-numbered layers are alternately assembled into an assembled structure of the iron core showed in FIG. 5.

The assembled structure of the iron core solves the following problems.

(1) Each basic layer has four right angles, wherein two right angles are overall right angles made of single materials and the other two right angles are formed right angles made of two different materials. Through the alternate assembly manner of the sheets of the two different materials, a uniform iron core of the high-voltage transformer is formed, which is unable to disassemble when wound by insulation paper and coils.

(2) The first long side of the iron core is wound by the electric energy measuring winding and the monitoring winding; because the first long side of the iron core is purely made of the permalloy sheets, the permeability performance in the right angles of the first long side of the iron core is not impaired by the different materials. The second long side of the iron core is wound by the first relay protection winding and the second relay protection winding, which are 5P class (generally for a double protection); and because the second long side of the iron core is purely made of the cold rolled silicon steel sheets, the permeability performance in the right angles of the second long side of the iron core is not enhanced by the different materials, which ensures high anti-saturation performance.

(3) The two short sides of the iron core are assembled by the permalloy sheets and the cold rolled silicon steel sheets arranged alternately; the permeability performance of the two short sides in the weak magnetic field is between the permeability performance of the first long side of the iron core and the permeability performance of the second long side of the iron core. The two short sides of the iron core are respectively wound by the third relay protection winding and the fourth relay protection winding, which are 3P class or 5P class, for the double protection, which improves the measurement precision and extends the measurement performance for the current from the hundredths to the thousandths of the rated current.

Referring to FIG. 1, a structure of the present invention and a winding method and a compensation method of the windings are illustrated, wherein: the assembled iron core has the first long side and the second long side, respectively purely assembled by the permalloy sheets and the cold rolled silicon steel sheets; even at corners along a section axis of the iron core, the permalloy sheets or the cold rolled silicon steel sheets are assembled, which maintains the magnetic permeability uniform and maximum.

The electric energy measuring winding and the monitoring winding are respectively wound on the first long side of the iron core. A last circle of the electric energy measuring winding and a last circle of the monitoring winding respectively come out of the respective short sides of the iron core neighboring with the first long side of the iron core. The permeability of the first long side of the iron core is reduced by half with the help of the two short sides of the iron core, because the two short sides are assembled by the sheets of the different materials, which is equivalent to slotting and threading in the middle of the iron core of the same material. A fractional turn compensation is realized by an error compensation method of "iron core+coil". The classes of the two windings are respectively "0.2Ss class" and "0.2Ss class" or "0.5Ss class". The electric energy measuring winding is able to meet the requirements of a high precision (0.2S class) measurement in the weak magnetic field condition. The monitoring winding is "0.2Ss-class" or "0.5Ss-class" according to the requirements of the customers, to satisfy the requirements of a measurement inputting precision of a telecontrol analog-to-digital conversion measuring module, an operation and monitoring microcomputer and an alternating current sampling and measuring module; and the new energy customers are able to precisely measure a running current in the weak magnetic field condition, which is good for an operation monitoring.

The second long side of the iron core is wound by the first relay protection winding and the second relay protection winding, which are similar to 5P class relay protection windings in the conventional high-voltage transformers and are mainly for the double protection for a main transformer or a bus.

The two short sides of the iron core are assembled by the permalloy sheets and the cold rolled silicon steel sheets arranged alternately. The permeability performance of the two short sides in the weak magnetic field is between the permeability performance of the first long side of the iron core and the permeability performance of the second long side of the iron core. The two short sides of the iron core are respectively wound by the third relay protection winding and the fourth relay protection winding, which are 3P class or 5P class, for the double protection, which improves the measurement precision and extends the measurement performance for the current from the hundredths to the thousandths of the rated current.

On the short sides: the two short sides of the iron core, assembled by the permalloy sheets and the cold rolled silicon steel sheets alternately, are respectively wound by the third relay protection winding and the fourth relay protection winding for extending a measuring range of a relay protection, wherein the measuring range is extended form (1% $I_N$-$I_N$) to (0.1% $I_N$-$I_N$).

On the first long side of the iron core: the first long side of the iron core is wound by the electric energy measuring winding for extending the measuring range of a measuring current, wherein the measuring range is extended from (1% $I_N$-$I_N$) to (0.1% $I_N$-$I_N$). An object of winding a circle on the corresponding short side (equal to a traditional half turn compensation) is to improve the measurement precision from conventional 3% or 5% (all wound on the permalloy sheets) to 0.2%. Winding the coils on an iron core purely made of cold rolled silicon steel is unable to measure the current in thousandths of the rated current and the measurement precision is only 5%, wherein the measurement precision is able to improve to only 3% by winding extra coils and thickening the iron core.

On the second long side of the iron core (purely assembled by the cold rolled silicon steel sheets) or on the two short sides are wound by the relay protection windings, wherein a thickness of the iron core and an amount of the coils decide that the measurement precision of the first relay protection winding and the second relay protection winding on the second long side of the iron core for the current is 3% or 5%; similarly, the thickness of the short sides of the different materials and the amount of the coils decide that the measurement precision of the third relay protection winding and the fourth relay protection winding for the current is 3% or 5%. It is noteworthy that the relay protection windings of the two short sides have the larger measurement precision than the relay protection windings of the second long side of the iron core and are able to measure the current in thousandths of the rated current.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A 0.2Ss class special-type high-voltage measuring current transformer, comprising: an iron core comprising two kinds of "L"-shaped sheets with the same size, wherein a ratio of a long side to a short side of each "L"-shaped sheet is 3:2; a first kind of said "L"-shaped sheets are permalloy sheets and a second kind of said "L"-shaped sheets are cold rolled silicon steel sheets; wherein:

a permalloy sheet is assembled with a cold rolled silicon steel sheet into a "rectangle" shape as a base layer of each layer of said iron core;

odd-numbered basic layers and even-numbered basic layers are arranged in an alternate assembly manner, wherein said alternate assembly manner comprises: each odd-numbered basic layer is identically arranged; each even-numbered basic layer is identically arranged; and each even-numbered basic layer is rotated 180 degrees along a horizontal center transverse axis relative to said corresponding odd-numbered basic layer;

an electric energy measuring winding and a monitoring winding are respectively wound on a first long side of said iron core, assembled by said permalloy sheets; a last circle of said electric energy measuring winding and a last circle of said monitoring winding respectively come out of respective short sides of said iron core neighboring with said first long side of said iron core;

a first relay protection winding and a second relay protection winding are respectively wound on said second long side of said iron core, assembled by said cold rolled silicon steel sheets, wherein said first relay protection winding is 5P class and said second relay protection winding is 5P class; and a third relay protection winding and a fourth relay protection winding are respectively wound on said two short sides of said iron core, wherein said third relay protection winding is 3P class or 5P class and said fourth relay protection winding is 3P class or 5P class; 3P and 5P are an accuracy class of every relay protection winding.

2. The 0.2Ss class special-type high-voltage measuring current transformer, as recited in claim 1, wherein said permalloy sheets are made of permalloy which is iron-nickel alloy with a nickel content of 70% to 81%.

* * * * *